United States Patent [19]

Wallia

[11] 3,764,950

[45] Oct. 9, 1973

[54] METHODS FOR MAKING SEMICONDUCTOR PRESSURE TRANSDUCERS AND THE RESULTING STRUCTURES

[75] Inventor: Perry S. Wallia, Mountain View, Calif.

[73] Assignee: Fairchild Camera and Instrument Corporation, Mountain View, Calif.

[22] Filed: July 17, 1972

[21] Appl. No.: 272,247

[52] U.S. Cl. .................... 338/2, 73/88.5 SD, 338/4, 338/5

[51] Int. Cl. .................... G01l 1/22

[58] Field of Search .................... 338/2, 4, 5; 73/88.5 R, 88.5 SD, 398 AR; 317/235 M

[56] References Cited

UNITED STATES PATENTS

| | | | |
|---|---|---|---|
| 3,417,361 | 12/1968 | Heller et al. | 338/4 X |
| 3,139,598 | 6/1964 | Rude | 338/4 |

*Primary Examiner*—C. L. Albritton

*Attorney*—Roger S. Borovoy et al.

[57] ABSTRACT

A semiconductor pressure transducer comprises a first portion of semiconductor material containing therein a hole, a second portion of semiconductor material placed over the top of said hole and strain sensitive electrical components formed on a selected surface of said first or said second portions of semiconductor material so as to be responsive to variations in pressures incident upon said transducer. A plurality of such semiconductor transducers are formed using semiconductor processing techniques by forming a plurality of holes in a first wafer of semiconductor material, forming a plurality of strain sensitive electrical components on a selected surface of either said first wafer or a second wafer of semiconductor material, then joining the first and second wafers of semiconductor material in a controlled pressure environment so as to seal said plurality of holes and finally separating the transducers from the composite structure.

13 Claims, 12 Drawing Figures

METHODS FOR MAKING SEMICONDUCTOR PRESSURE TRANSDUCERS AND THE RESULTING STRUCTURES

BACKGROUND OF THE INVENTION

1. Field of the Invention

This invention relates to semiconductor pressure transducers and in particular to semiconductor pressure transducers capable of being manufactured using semiconductor processing techniques so as to achieve both significant cost reductions over prior art manufacturing techniques together with accurate and predictable performance from the resulting pressure transducers. In particular, this invention relates to a method for combining two wafers of semiconductor material to yield a plurality of semiconductor pressure transducers the diaphragms of which are integrally mounted with the supporting material and the reference pressures of which are accurately and reproducably obtained.

2. Prior Art

Semiconductor pressure transducers are well known. For example, Pfann in U.S. Pat. No. 3,186,217 discloses a piezoresistive stress transducer making use of the fact that many semiconducting materials exhibit variations in piezoresistive or elastorestive coefficients depending on the crystallographic orientation and the conductivity type of the crystal. Fenner in U.S. Pat. No. 3,251,222 discloses a semiconductive strain sensitive element having isotropic electrical characteristics. Kabell in U. S. Pat. No. 3,161,844 discloses an integral sensing beam and base formed of one piece of single-crystal semiconducting material. Kabell diffuses acceptor or donor impurities in the sensing beam so that the sensor is quite small and accurately dimensioned.

Heretofore, seiconductor pressure transducers have been expensive to manufacture and each transducer has had to be individually calibrated. Calibration is an expensive and time consuming operation. Semiconductor pressure transducers are of two types, gauge and absolute. Gauge semiconductor pressure transducers measure differences in pressure across a semiconductor diaphragm while absolute pressure transducers incorporate on one side of the diaphragm a known reference pressure which typically is a vacuum. However, this reference pressure could also be any sealed reference pressure desired. As described in a paper by A. D. Kurtz entitled "The Design and Fabrication of Transducers for the Measurement of Fluctuating Pressures from DC to over 100Khz in Jet Engine Testing," published in Volume 17, 1971 of the Instrument Society of America and presented at the May 10–11, 1971 Instrumentation Symposium, Las Vegas, Nevada, the typical way in which the reference pressure is obtained in an absolute pressure transducer is by providing a reference tube to a cavity behind the semiconductor diaphragm. This reference tube is used to evacuate the cavity and then the tube is sealed. Thus each pressure transducer must have the vacuum or other reference pressure formed independently in the cavity. This results in variations in reference pressure from transducer to transducer and increases the cost of the transducers.

SUMMARY OF THE INVENTION

This invention overcomes many of the disadvantages of prior semiconductor pressure transducer structures and the methods of fabricating these structures. This invention provides methods for making simultaneously a plurality of semiconductor pressure transducers which insure that the reference pressures in the cavities associated with the transducers are equal and which allow the simultaneous formation of the plurality of transducers using semiconductor processing techniques. Using the techniques of this invention, semiconductor pressure transducers capable of measuring either gauge or absolute pressures can be formed. However, this technique is particularly advantageous when used to form semiconductor pressure transducers capable of measuring absolute pressures.

According to this invention, a plurality of cavities are formed in an arranged pattern on a first wafer of semiconductor material. These cavities can either pentrate part way through the first wafer if the resulting transducers are to be used to measure absolute pressures or completely through the wafer if the resulting transducers are to be used to measure gauge pressures.

The electrical circuitry and strain sensitive elements are then formed on either the portions of the first wafer which serve as the diaphragms or on the portions of a second wafer which, when combined with the first wafer, serve as the flexible diaphragms adjacent the cavities.

The electrical circuitry associated with each transducer is placed on that portion of the transducer's diaphragm in such a manner that the strain sensitive portion of the circuitry is in the position of maximum stress concentration when the diaphragm deflects. However, this circuitry could in general be placed in any position on the diaphragm provided that the stress sensitive electrical components of the circuitry generate the desired signal in response to deflection of the diaphragm.

After the cavities have been formed in the first wafer of semiconductor material, and the electrical circuitry has been formed in the diaphragm regions of semiconductor material, the second semiconductor wafer is aligned with the first wafer and sealed to this first wafer by use of a sealing material. Typically this sealing material comprises a glass with a low melting temperature and preferably with a temperature coefficient of expansion which matches that of the semiconductor material. A glass suitable for use with silicon semiconductor material is disclosed in U.S. Pat. No. 3,650,778 issued Mar. 21, 1972 on an invention of Maurice Dumesnil entitled "Low-Expansion, Low-Melting Zinc Phosphoranadate Glass Composition."

The two wafers are sealed together in a controlled pressure enviroment which can vary from a pure vacuum to any selected pressure although typically this selected pressure is somewhere between a vacuum and the expected atmospheric pressure in which the transducers will be operating. Because all transducers are formed in the same pressure enviroment, the reference pressures of all transducers in the wafer will be identical. The electrical performance of each transducer in the wafer can then be determined before the transducers are separated by placing the wafer containing the plurality of transducers into a variable pressure environment and measuring the electrical output signals from each transducer as a function of a change in external pressure. By placing this structure in a temperature check, the transducers can be tested and yield of useful transducers determined while the transducers are still part of the composite wafer.

After the first and second wafers have been sealed to each other, the composite wafer contains a plurality of semiconductor transducers. Typically, when each transducer is about 160 mils square, 85 dice can be formed using semiconductor wafers of 2 ½ inch diameter. When the transducers decrease in size to 120 mils on a side, the number of transducers obtained from a composite wafer with a 2 ½ inch diameter increases to a maximum of about 200.

An advantage of using the methods of this invention is that the sizes of the transducers produced by these methods are limited only by the accuracy and resolution of the semiconductor processing techniques. Thus extremely small pressure transducers can be produced using the methods of this invention.

DETAILED DESCRIPTION

Figure 1A:
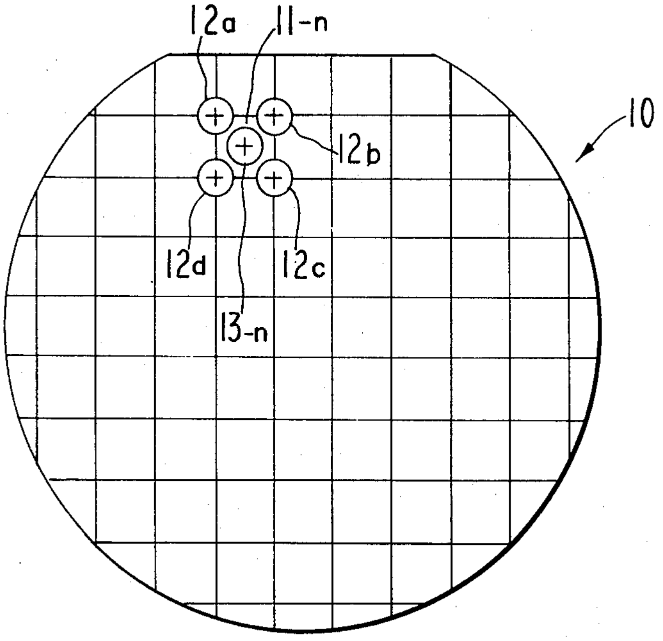
FIG. 1*a* shows a first wafer of semiconductor material containing cavities (only one shown for simplicity) which extend through the wafer surrounded by four throughholes.

As shown in FIG. 1*a*, a wafer 10 of semiconductor material has formed in its cavities such as cavity 13-*n*. For convenience, one such cavity is shown in FIG. 1*a* but it should be understood that each square section of the wafer 10 has formed in it a corresponding cavity 13. Thus, if there are N complete squares in wafer 10, each of these squares will contain a cavity equivalent to cavity 13-*n* shown in square 11-*n*. It should be noted that *n* is an integer which can vary from 1 to N.

Cavity 13-*n* can either be a blind hole extending only part way through the wafer, or can extend all the way through the wafer. Hole 13-*n* can be formed in many ways such as by electrochemical etching, standard etching, laser cutting, or any other technique suitable for accurately forming holes in semiconductor material.

Figure 1B:
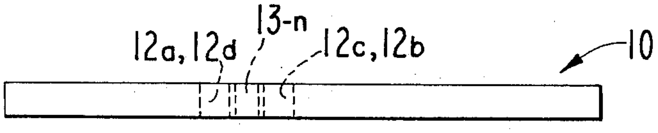
FIG. 1*b* shows the side view of this wafer.

Surrounding hole 13-*n* are four holes 12*a* through 12*d* which go completely through wafer 10 as shown in the side view in FIG. 1*b*, In FIG. 1*b*, cavity 13-*n* is also shown to extend completely through the wafer.

Figure 2:
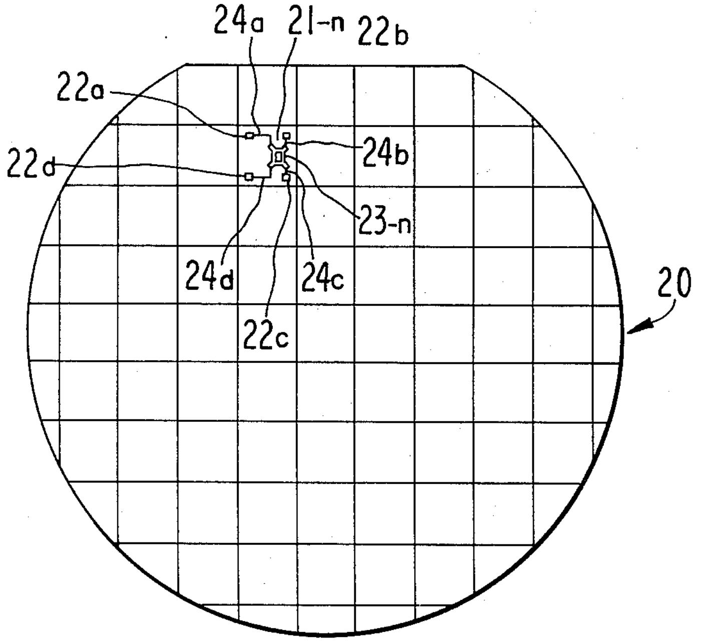
FIG. 2 shows a second wafer of semiconductor material containing electrical circuits (only one shown for simplicity) which correspond to the cavities in the wafer of FIG. 1*a;*

FIG. 2 shows the electrical circuit formed in the region 21-*n* of a second wafer 20 of semiconductor material which corresponds in location to the location of cavity 13-*n* formed in region 11-*n* of wafer 10. Circuit 21-*n* is essentially a wheatstone bridge circuit of well-known design containing four resistive arms formed by the diffusion of a selected conductivity-determining impurity into the semiconductor material. The bridge 23-*n* is formed in a portion of semiconductor material in region 21-*n* which, when wafers 10 and 20 are joined together, is that part of a pressure transducer diaphragm which receives a selected amount of stress for a given deflection of the semiconductor material in response to pressure variations in the finished transducer. Thus bridge 23-*n* will be over cavity 13-*n* when wafer 20 is joined to wafer 10 in proper alignment. Attached to the corners of bridge 23-*n* are conductive paths 24*a* to 24*d* leading to bonding pads 22*a* to 22*d* to which lead wires are attached for transmitting the electrical signals generated by bridge 23-*n* in response to deflections of the semiconductor diaphragm. Thus lead wire 24*a* attaches one corner of bridge 23-*n* to contact 22*a*. Similarly, lead wires 24*b*, 24*c* and 24*d* connect corresponding corners of bridge 23-*n* to bonding pads 22*b*, 22*c* and 22*d* respectively.

Figure 3:
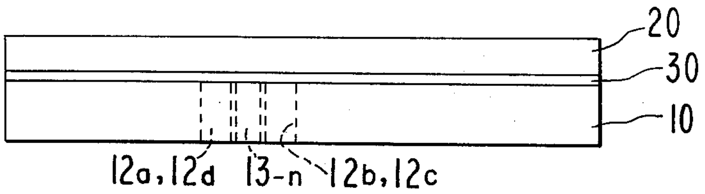
FIG. 3 shows a side view of the wafers of FIG. 1*a* and FIG. 2 bonded together.

FIG. 3 shows wafer 20 joined to wafer 10. Typically, wafer 20 is joined to wafer 10 by a glass frit which has a thremal expansion coefficient approximately equal to the expansion coefficient of the underlying semiconductor materials although if desired other joining material can also be used. Wafer 20 must be carefully aligned with wafer 10 to insure that the resistive bridge circuits formed on wafer 20 align with the cavities 13 formed in wafer 10 so that the desired electrical signals are generated by given deflections of those portions of wafer 20 over cavities 13 in response to a given pressure variation.

When cavities 13 are formed completely through wafer 10, the resulting transducers are suitable for measuring gauge pressures. However, in some instances, a cavity similar to cavity 13-*n* will be formed only part way through wafer 10 and thus resulting transducer will be suitable for measuring absolute pressures. Cavity 17-*n* in FIGS. 5*e* and 5*f* goes only part way through the wafer.

Figures 4A, 4B:
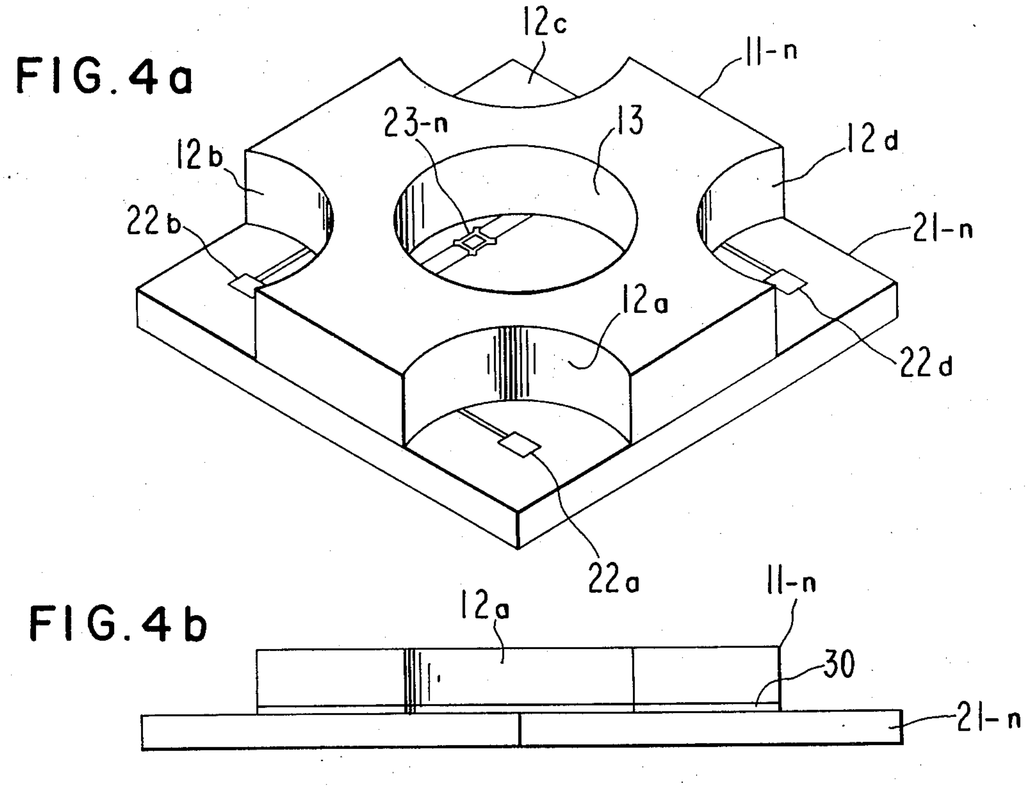
FIGS. 4*a* and 4*b* show isometric and side views respectively of one transducer removed from the composite structure shown in FIG. 3.

FIGS. 4*a* and 4*b* show isometric and side views of one transducer after it has been removed from the composite wafer shown in FIG. 3. The bonding pads 22*a* through 22*d* are exposed by means of the through-holes 12*a* through 12*d* formed in wafer 10 surrounding cavity 13-*n*. Cavity 13-*n* extends completely through portion 11-*n* of wafer 10. Formed within that portion of semiconductor material which serves as the diaphragm to cavity 13-*n* is bridge 23-*n*. The conductive leads from the corners of bridge 23-*n* to each of the bonding pads 22*a* through 22*d* are clearly shown in FIG. 4*a*. The glass frit 30 (FIG. 4*b*) joins the portion of semiconductor material 21-*n* containing the diaphragm to the portion of semiconductor material 11-*n* containing cavity 13-*n*.

It should be noted that the conductive leads from the corners of bridge 23-*n* could also, if desired, be brought to external circuitry through cavity 13-*n* rather than by use of through-holes 22*a* through 22*d*. This simplifies somewhat the wafer processing required to produce a gauage pressure transducer and also simplifies the packaging of such a transducer.

Figure 5B:
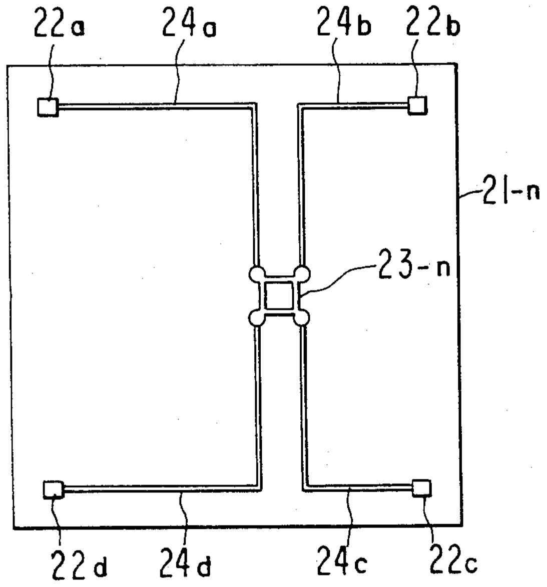
FIGS. 5*a* and 5*b* show the two semiconductor parts, the diaphragm 21-*n* and the support 11-*n*, of the one transducer of FIGS. 4*a* and 4*b* in more detail to illustrate the support 11-*n* containing the cavity and access openings; and the circuit formed on diaphragm 21-*n* together with the leads and contact pads to this electrical circuit.
Figure 5A:
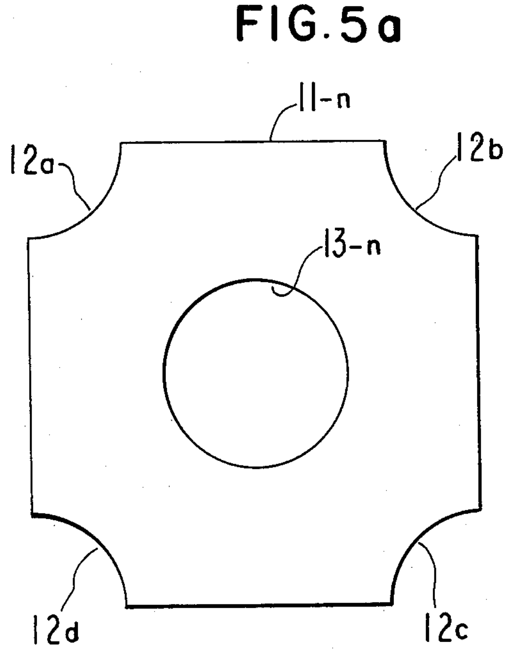

FIGS. 5*a* and 5*b* show a top view of the portions 11-*n* and 21-*n* comprising a single discreet transducer.

Figure 5C:
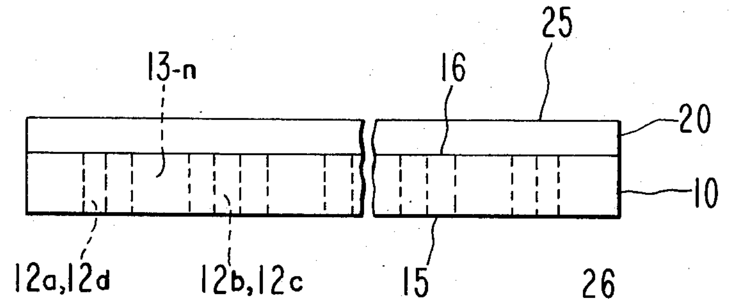
FIGS. 5*c* through 5*f* show in side view various configurations capable of being constructed using the techniques of this invention.

FIG. 5*c* shows the composite structure produced by joining wafer 10 (FIG. 1*a*) to wafer 20 (FIG. 2). It should be noted that although these drawings are not done to scale, wafer 20 is typically several times thinner than is wafer 10. Typical dimensions for wafer 20 are 1 mil or so thick while wafer 10 might be as much as 5 mils thick. It should be noted that as the cavity 13-*n*, shown in FIG. 5*c* extending all the way through wafer 10, decreases in diameter, the thickness of wafer 20 likewise can decrease to obtain the same performance from the transducer. In the structure shown in FIG. 5*c*, the electrical circuits are formed on face 26 of wafer 20. This is the face joined to the top face 16 of wafer 10 by the glass frit. Thus the semiconductor circuit is directly adjacent to cavity 13-*n*. The lead wires contacting pads 22*a* through 22*d* (not shown in FIG. 5*c*) are brought out to the external circuitry through through holes 12*a* through 12*d*.

Figure 5D:
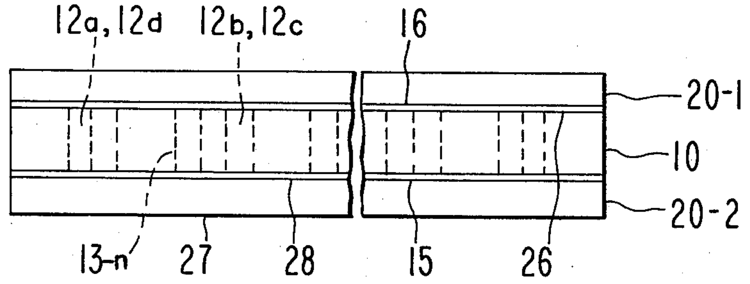

FIG. 5*d* shows a configuration wherein the semiconductor wafer 10 with cavities 13 extending from one face to the other face is used as an absolute pressure gauge rather than a gauge pressure transducer. In FIG. 5*d*, while cavities 13 extend through wafer 10, a second wafer 20-2 is placed on the bottom face 15 of wafer 10 thus sealing both sides of each cavity 13-*n*. This second wafer is joined to wafer 10 in a controlled pressure environment, typically although not necessarily a vacuum. The resistive bridges and electrical circuits can be formed on either face of wafer 20-1 or 20-2. If formed on the inner face of one of these two wafers, the leads must be brought from the transducer to the external circuitry through holes 12*a* through 12*d* and corresponding holes in one of the wafers 20-1 and 20-2.

Figure 5E:
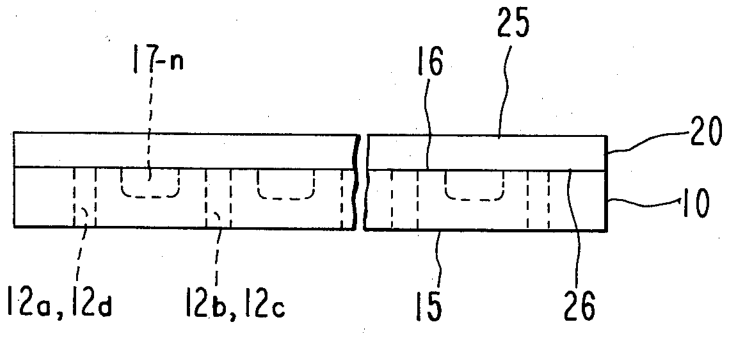

FIG. 5*e* shows a structure which yields a plurality of absolute pressure transducers using only two wafers. In the structure of FIG. 5*e*, the cavities 17-*n* are formed only part way through wafer 10. Wafer 20 is then joined to the surface of wafer 10 to which the cavities 17 extend thus sealing in these cavities the pressure of the enviroment in which wafers 10 and 20 are bonded. Typically wafer 20 is sealed to wafer 10 in a vacuum. Thus cavities 17 contain a vacuum. The resistive bridges have been formed on a selected surface of the diaphragms adjacent the cavities 17. For instance, these bridges can be formed on the bottom surface 26 of wafer 20, or on the top surface 25 of wafer 20. These bridges can also be formed on the bottom surface 15 of wafer 10. When this bridge is formed on the exposed outer surfaces of wafer 20 or 10, no through holes such as holes 12*a* through 12*d* are needed to bring the leads from the bridge to external circuitry. Thus a significant reduction in complexity is obtained by forming these bridge circuits on the exposed faces of either wafer 10 or wafer 20.

Figure 5F:
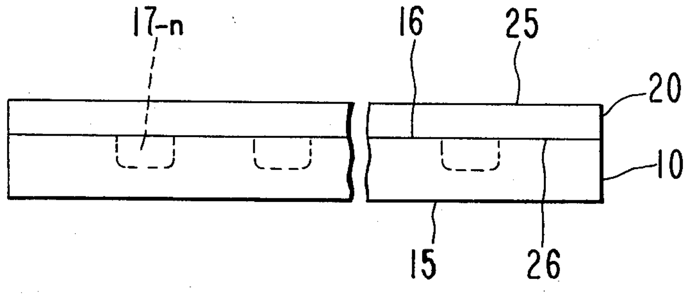

FIG. 5f shows the structure which is obtained when, in fact, these bridge circuits are formed on the external face 25 or 15 of wafers 20 or 10 respectively.

In forming the bonded structure shown in FIGS. 3, 5*c* through 5*f* and 4*a* and 4*b*, wafer 20 must be aligned with wafer 10. When through-holes 12*a* through 12*d* are used, this alignment can be carried out by visually observing the presence of bonding pads 22*a* through 22*d* properly aligned in through-holes 12*a* through 12*d*. Only two holes must be aligned in each wafer and then all the devices on the two wafers are properly aligned because of the similarities in the mask patterns used to form the devices in each wafer.

To align the structure of FIG. 5*f*, special alignment marks can be used on wafers 10 and 20. Such two-sided alignment techniques are commonly used in aligning masks in the semiconductor industry.

It should be noted that other structures can also be manufactured using the processes of this invention. For example, the criticality of alignment of the two wafers of semiconductor material can be reduced by removing selected amounts of material from, for example, surface 16 of wafer 20 in FIG. 5*e* above cavities 17 formed in wafer 10. The plan area of the material removed from wafer 20 is made much smaller than the plan area of cavities 17 but the holes left by the removed material each align above a corresponding one of cavities 17. By making the plan areas of the holes in wafer 20 smaller than the plan areas of the cavities 17 in wafer 10, the precision and accuracy with which wafer 20 must be aligned with wafer 10 is considerably reduced. In this structure, those portions of wafer 20 over the material removed from wafer 20 act as the pressure sensitive diaphragms and the electrical circuitry is formed on the opposite face of these portions of semiconductor material.

What is claimed is:

1. Structure which comprises:

a first semiconductor wafer with a first surface and a second surface and a plurality of holes formed in said first surface;

a second semiconductor wafer containing a first surface and a second surface;

means joining said first wafer to said second wafer and a plurality of strain sensitive electrical components formed on a selected surface of said two wafers in cooperating relationship to said plurality of holes.

2. Structure as in claim 1 wherein said strain sensitive electrical components are formed on said first surface of said second wafer.

3. Structure as in claim 1 wherein said plurality of strain sensitive electrical components are formed on said second surface of said second wafer.

4. Structure as in claim 1 wherein said plurality of strain sensitive electrical components are formed on said second surface of said first wafer.

5. Structure as in claim 1 wherein said plurality of holes extend part way through said first wafer.

6. Structure as in claim 1 wherein saidplurality of holes extend completely through said first wafer.

7. Structure as in claim 1 wherein said plurality of strain sensitive electrical components are formed on said selected surface in a position such that maximum electrical signal is generated for a given deflection of said selected surface.

8. Structure as in claim 1 wherein a vacuum exits in each of said holes.

9. Structure as in claim 1 wherein each of said holes contains a selected reference pressure.

10. A semiconductor transducer comprising a first portion of a semiconductor material containing therein a hole;

a second portion of semiconductor material placed over the top of said hole, said hole containing a selected reference pressure; and strain sensitive electrical components formed on the bottom surface of said first portion of semiconductor material so as to be responsive to variations in pressures incident upon said transducer.

11. Structure as in claim 10 wherein said selected reference pressure is a vacuum.

12. The method of manufacturing a plurality of semiconductor transducers simultaneously which comprises forming a plurality of holes in a first wafer of semiconductor material;

forming a plurality of strain sensitivity electrical components on a selected surface of a second wafer of semiconductor material;

joining in proper alignment said first wafer of semiconductor material and said second wafer of semiconductor material such that said second wafer of semiconductor material covers the holes in said first wafer of semiconductor material in a selected manner.

13. A semiconductor pressure transducer formed from the structure of claim 1 comprising a strain sensitive electrical component and a hole formed by subdividing the said two semiconductor wafers of claim 1 into individual units, each of which contains one of said strain sensitive electrical components and one hole.

* * * * *

Notice of Adverse Decision in Interference

In Interference No. 99,049, involving Patent No. 3,764,950, P. S. Wallia, METHODS FOR MAKING SEMICONDUCTOR PRESSURE TRANSDUCERS AND THE RESULTING STRUCTURES, final judgment adverse to the patentee was rendered Nov. 9, 1977, as to claims 1–13.

[*Official Gazette February 14, 1978.*]